TUNING MECHANISM

Filed Dec. 5, 1958

INVENTOR:
JULIUS KEMENY,

BY Joseph Levinson
HIS ATTORNEY.

1

2,962,903

TUNING MECHANISM

Julius Kemeny, Liverpool, N.Y., assignor to General Electric Company, a corporation of New York Filed Dec. 5, 1958, Ser. No. 778,482
5 Claims. (Cl. 74—10.27)

Figures 1, 2, 3, 4, 5, 6:
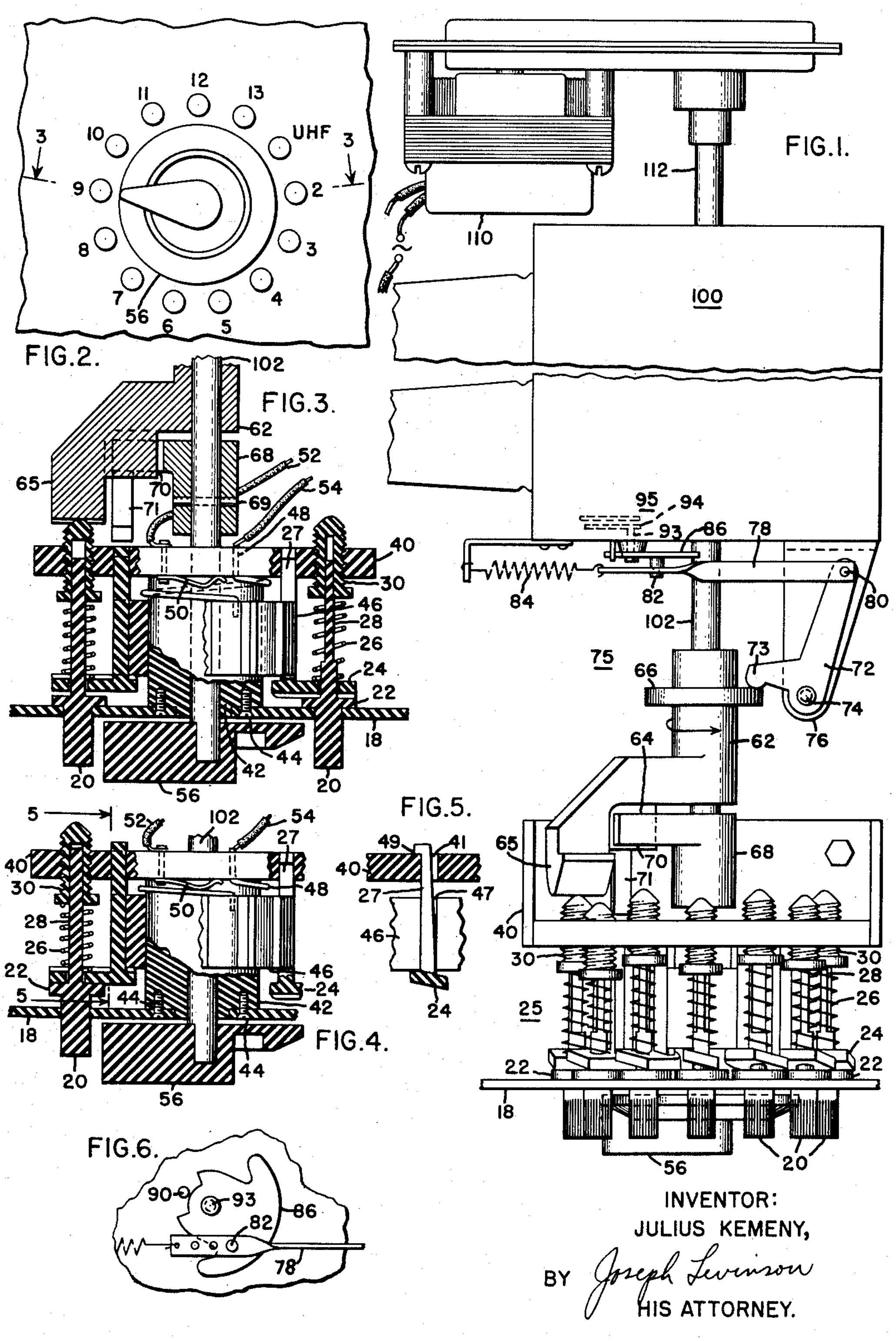

This invention relates to an automatic tuning system for a television receiver, and more particularly to improvements in a tuning system which provides automatic fine tuning and automatic channel selection.

An automatic fine tuning and channel selection system of the type in which the improvements herein are directed is shown and described in an application Serial Number 730,896, now Patent No. 2,901,615 issued August 25, 1959, entitled "Automatic Tuning System" which is assigned to the assignee of this invention. In the aforesaid system a channel selector knob is provided having a plurality of push buttons thereon each representing a different television channel. Each push button has associated therewith a separate spring contact finger for closing a motor circuit when the button is depressed thereby rotating the entire channel selector structure until the circuitry in the tuner is switched to select the desired channel. It would be desirable to maintain the push buttons in a stationary position for the convenience of the viewer yet to retain the advantages of the aforesaid system. In maintaining the push buttons in a fixed position, the viewer becomes accustomed to the position of a particular button for its associated channel and does not have to continually refer to the numbers on the dial to select the proper channel.

Accordingly, it is an object of this invention to provide an improved automatic fine tuning and channel selection system for a television receiver in which the channel selection means remains stationary.

In the system of the above identified application, a separate contact is required for each push button in order to close a motor circuit which drives the tuner shaft and provides the channel switching. It would be advantageous to have one set of contacts to close the motor circuit for all of the push buttons.

Therefore, it is another object of this invention to provide an improved automatic tuning system having a single pair of contacts associated with all of the channel selection push buttons for closing the motor circuit to thereby select any one of the desired channels.

Still a further object of this invention is to provide an improved automatic tuning system which is simple in construction and less expensive than other tuning systems of similar type.

In carrying out this invention, a plurality of stationary channel selection push buttons are adapted to activate a common switch in a motor circuit. The motor when activated by the switch drives a tuner shaft which selects the desired channel, and means are provided for opening the motor circuit to thereby stop the shaft rotation when the desired channel is reached. Channel selection is thereby automatically accomplished by depressing the push button of the desired television channel. Each push button also has associated therewith an adjustable fine tuning screw for each channel which is adapted to be adjusted by its associated push button. The setting of the fine tuning screw is transmitted by fine tuning linkage means to a variable impedance element in the tuner for

2 the adjustment thereof in accordance with the setting of the fine tuning screw. Once the fine tuning adjustment is made by rotating the push button for that particular channel, it is set such that subsequent selection of the same channel automatically provides fine tuning for that channel.

These and other advantages of this invention will be more clearly understood from the following description taken in connection with the accompanying drawings, and its scope will be apparent from the appended claims.

In the drawings:

Figure 1 is a side view of the automatic tuning system embodied in this invention, Figure 2 is a front view of the channel selection means of the automatic tuning system shown in Figure 1, Figure 3 is a cross-sectional view taken along lines 3—3 of Figure 2, Figure 4 is a partial cross-sectional view as shown in Figure 3 showing a push button in its activated position, Figure 5 is a cross-sectional view taken along lines 4—4 of Figure 4, and Figure 6 is a front view of a portion of the fine tuning linkage means of the automatic tuning system shown in Figure 1.

Referring now to Figure 1, the automatic tuning system embodied in this invention generally comprises a channel selector means 25, a fine tuning linkage means 75, a tuner 100 and a motor 110. The motor 110 drives a shaft 112 which is suitably coupled to a tuner shaft 102 of the tuner 100. Since tuner circuitry is well known in the art, it is assumed that the necessary electrical circuits are provided within the tuner 100 and that the rotation of the tuner shaft 102 may be utilized to switch the various circuits within the tuner to provide the desired channel.

The channel selector means 25 has a support member 18 having a plurality of push buttons 20 positioned through openings therein. As shown in Figure 2, the push buttons 20 are provided for each of the television channels 2 through 13 with an extra button being provided to accommodate UHF. An indicator knob 56 is mounted on the end of the tuner shaft 102 and rotatable therewith to provide an indication of the channel to which the receiver is tuned. Each push button is provided with an angular flange 22 thereon for positioning the respective push buttons in their respective openings in the support member 18. The push buttons 20 have mounted thereon a detent 24 having a leg portion 27 with a flange 49 thereon which is best seen in Figures 3, 4 and 5. The push buttons 20 are provided with an end portion 28 having a rectangular configuration adapted to fit in a rectangular opening in an associated fine tuning screw 30. The fine tuning screws 30 are mounted for rotatable adjustment by its associated push push button in a support member 40. A spring 26 is mounted on each push button 20 between the detent 24 and the fine tuning screw 30. Each detent is inclined at an angle such as to provide a downward bias on the leg 27 of the detent 24, the reason for which will be subsequently explained. A sleeve 42 is mounted on the support member 18 by a plurality of screws 44. The sleeve 42 carries a collar 46 which is axially movable thereon. The collar 46 is notched at 47 (see Figure 5) to carry the detent legs 27. The detent legs 27 are thus axialy movable into a plurality of openings 41 in the support 40. Consequently, when a push button is depressed its flange 22 bears on the inclined surface of the detent 24 which tensions the spring 26. Since the detent has an inclined surface the detent leg 27 is forced downward into the opening 41 such that it is retained by the flange 49 in the support 40. The push button remains in this position until released which will subsequently be explained. A ring contact 48 is mounted at one end thereof in the support member 40 and at the other end thereof in the collar 46. A spring contact is mounted in the support member 40 and is adapted to be contacted by the ring contact 48. A conductor 52 is connected to the spring contact 50, and a conductor 54 is connected to the ring contact member 48. The conductors 52 and 54 may be connected in a circuit which supplies power to the motor 110 when the circuit is closed by the contacts 48 and 50. For example, conductor 52 could be connected to one side of source of potential as shown in Figure 1 while a field winding of the motor is connected to the other side, and the other field winding and conductor 54 could be connected together or each could be connected to ground.

As is best shown in Figure 3, a disconnector yoke 68 is mounted on the tuner shaft 102 for rotation therewith by any suitable means, such as a set screw, pin or bolt, through the opening 69 for rotation therewith. The disconnector yoke 68 has a U-shaped section 70 thereon to which a disconnector finger 71 is secured. On rotation of the tuner shaft 102, the disconnector yoke 68 rotates therewith and the extension finger 71 is adapted to contact any detent leg 27 which has been activated and extends through the opening 41 in the support 40. When the extension finger 71 contacts the detent leg 27, the detent is released from the notch 49 thereby releasing the tension on its associated spring 26, and returning the associated push button to its unoperated position.

The channel selection function is accomplished by depressing the push button 20 of the channel desired to be selected. The push button 20, the detent 24 and the collar 46 move as a unit toward the support member 40. The leg 27 of the detent 24 passes through the opening 41 in the support 40 and engages the support 40 at the flanged or notched portion 49. At the same time the contact ring 48 is compressed to the point where it touches the contact spring 50 thereby closing the motor circuit represented by the conductors 52 and 54 to energize the motor 110. The motor 110 drives the motor shaft 112 and accordingly the tuner shaft 102 until the extension finger 71 of the disconnector yoke 68 comes into contact with the detent leg 27 thereby releasing the detent 24 and allowing the spring 26 and the contact ring 48 to return the detent 24, the push button 20 and the collar 46 to their original positions which also breaks the electrical contact between the spring contact 50 and the ring contact 48. The channel selected is locked in by a well known detent mechanism commonly employed in tuners which prevents the channel selector from overshooting the desired channel. If the operator desires, the channel selector knob may be manually rotated to select channels.

In order to obtain fine tuning, the fine tuning screws 30 are adapted to be adjusted by an associated push button 20. The setting of the fine tuning screws 30 is transmitted by a fine tuning linkage means 75 to a variable impedance element 95 in the tuner 100 to adjust the frequency of a given channel within a given range thereby providing the requisite fine tuning.

The fine tuning linkage means 75 which performs the function of transmitting the setting of a fine tuning screw 30 into a finite impedance in acordance with such a setting is shown in Figure 1, and portion thereof in Figure 6. The fine tuning linkage means 75 includes a sleeve 62 having a projection 65 thereon for making contact with the fine tuning screws. The sleeve 62 also includes a flange 66 and a tongue 64. The sleeve 62 is adapted to move axially along the tuner shaft 102. It also rotates with the shaft in the direction of the arrow on the drawing due to the tongue portion 64 which couples the sleeve to the U-shaped portion 70 of the disconnector yoke 68. An arm 72 having a projection 73 thereon which rides on the flange 66 of the sleeve 62 is mounted on a bracket 76 and adapted to pivot at points 74 and 80. A linkage arm 78 is mounted on the bracket 76 at the point 80 and is thereby driven by the pivotal motion of the arm 72. A spring 84 is connected to the other end of the linkage arm 78 to provide tension thereon. The linkage arm 78 is adapted to rotate a disc 86 to which it is coupled by a linkage 82. In turn the disc 86 drives a fine tuning shaft 93 to turn a variable plate 94 of the variable impedance element 95 in order to change the impedance thereof. As will be seen in Figure 6, a stop element 90 restricts the movement of the disc 86 within the variable range of the variable impedance element 95. Although a variable capacitor is shown, a variable inductance could be employed.

Fine tuning is accomplished by rotating the push button 20 for the desired channel in order to set its associated fine tuning screw 30. This setting is transmitted to the sleeve 62 which moves axially along the shaft 102 in accordance with the position of the fine tuning screw 30. The axial movement of the sleeve 62 pivots the arm 72 to thereby transmit the movement of the arm 72 to the linkage arm 78 which in turn rotates the fine tuning shaft 93 of the variable impedance element 95. Once the fine tuning adjustment is made, no further adjustment is required should the operator switch to another channel and then decide to return to the one which has been previously set. When the sleeve 62 is rotated by the tuner shaft and comes into contact with a given setting of a fine tuning screw the sleeve moves axially and the arm 72, the linkage arm 78 and the disc 86 transmit the axial motion of the sleeve into radial motion to vary the impedance of the variable impedance element 95 thereby providing fine tuning.

Consequently, automatic channel selection is attained by merely pressing the push button of the desired channel which thereby activates the motor 110 to drive the tuner shaft to the proper channel. Fine tuning is achieved by merely rotating the push button of the channel desired to be fine tuned. Both of these functions have been accomplished utilizing stationary push buttons for the convenience of the user. The use of the stationary push buttons for channel selection and fine tuning eliminates the necessity for having individual contacts associated with each push button for closing the motor circuit to make the proper channel selection. In accordance with this invention only two contacts are required which are controlled by any one of a plurality of push buttons.

Since other modifications varied to fit particular operating requirements and environments will be apparent to those skilled in the art, this invention is not considered limited to the examples chosen for purposes of disclosure and covers all changes and modifications which do not constitute departures from the true spirit and scope of this invention.

What I claim as new and desire to secure by Letters Patent of the United States is:

1. A tuning system for providing channel selection for a tuner of a television receiver, comprising in combination, a tuner having a tuner shaft, a motor having a drive shaft coupled to said tuner shaft which is driven thereby, an energizing circuit for said motor, a stationary support member having a plurality of push buttons each representing a different television channel mounted for axial movement thereon, a first and second electrical contact in said energizing circuit which are normally open, a support member having said first electrical contact mounted thereon, a collar mounted for axial movement on said tuner shaft and carrying said second electrical contact, detent means on each of said push buttons for axially moving said collar to close said first and second contacts when any push button is depressed whereby said motor is energized to rotate said tuner shaft, means for holding said detent means in a depressed position, and means on said tuner shaft for releasing said detent means of a depressed push button when the tuner shaft is rotated a predetermined amount in accordance with the push button depressed.

2. An automatic tuning system for providing automatic channel selection and fine tuning for a television receiver comprising in combination, a tuner having a tuner shaft, a variable impedance element in said tuner for providing fine tuning therefor, a motor coupled to said tuner shaft for rotatably driving said tuner shaft, a motor energizing circuit having a normally open pair of contacts therein for supplying operating potential to said motor when said contacts are closed, a stationary support member having a plurality of push buttons positioned thereon for axial movement therein, a second support member spaced from said stationary support member, a plurality of fine tuning screws mounted for rotatable movement by an associated push button in said second support member, one of said pair of contacts mounted on said second support member, means on said tuner shaft carrying the other contact of said pair of contacts which is adapted to be moved axially by any one of said push buttons to close said contacts and thereby activate said motor circuit, a fine tuning linkage means coupled to said variable impedance element, said fine tuning linkage means being selectively engageable with said fine tuning screws whereby the setting of a fine tuning screw is transmitted by said fine tuning linkage means to said variable impedance element to vary the impedance thereof.

3. The structure set forth in claim 2 wherein said fine tuning linkage means includes a sleeve mounted for axial and rotatable movement on said tuner shaft which is selectively engageable with said fine tuning screws at one portion thereon, an arm mounted for pivotal movement at one end portion on said tuner and having the other end portion coupled to another portion of said sleeve for pivotal movement by the axial movement of said sleeve, and a linkage arm coupled to said one end portion of said arm and to said variable impedance element for transmitting movement of said arm to said variable impedance element to vary the impedance thereof.

4. In a tuning system comprising in combination, a first support member having a plurality of push buttons positioned for axial and rotatable movement therein, a second support member having a plurality of fine tuning screws rotatably mounted therein wherein each fine tuning screw receives and is adapted to be rotated by an associated push button, a tuner having a tuner shaft extending through and rotatable in said first and second support members, a sleeve having a projection thereon for engaging any one of said fine tuning screws, said sleeve riding on said tuner shaft for axial movement thereon in accordance with the setting of the fine tuning screw engaged, a tongue portion on said sleeve, a yoke mounted on said tuner shaft for rotation therewith, means on said yoke cooperating with said tongue portion for rotating said sleeve when said tuner shaft rotates, a variable impedance element in said tuner, and linkage means coupled between said sleeve and said variable impedance element for varying the impedance of said variable impedance element in accordance with the movement of said sleeve.

5. The structure set forth in claim 4 wherein said linkage means include an arm pivotally mounted at both end portions on a bracket on said tuner, said arm having a projection at one end portion coupled to said sleeve for transmitting the motion of said sleeve to said arm, a linkage arm coupled to the other end portion of said arm and to said variable impedance element to transmit the movement of said arm to said variable impedance element.

References Cited in the file of this patent

UNITED STATES PATENTS

| | | |
|---|---|---|
| 2,203,723 | FitzGerald | June 11, 1940 |
| 2,232,787 | Kenney et al. | Feb. 25, 1941 |
| 2,465,956 | Yardeny | Mar. 29, 1949 |
| 2,627,056 | Gleason | Jan. 27, 1953 |
| 2,743,797 | Whitaker | May 1, 1956 |
| 2,755,424 | Papitto | July 17, 1956 |
| 2,821,676 | Beiser | Jan. 28, 1958 |
| 2,833,976 | Kennedy et al. | May 6, 1958 |
| 2,834,886 | Thompson | May 13, 1958 |
| 2,877,351 | Saire | Mar. 10, 1959 |
| 2,903,894 | Legros | Sept. 15, 1959 |
| 2,915,691 | Tyzack | Dec. 1, 1959 |